United States Patent
Micovic et al.

(10) Patent No.: US 7,598,131 B1
(45) Date of Patent: Oct. 6, 2009

(54) HIGH POWER-LOW NOISE MICROWAVE GAN HETEROJUNCTION FIELD EFFECT TRANSISTOR

(75) Inventors: Miroslav Micovic, Newbury Park, CA (US); Tahir Hussain, Calabasas, CA (US); Paul Hashimoto, Los Angeles, CA (US); Mike Antcliffe, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/290,921

(22) Filed: Nov. 5, 2008

Related U.S. Application Data

(62) Division of application No. 10/313,374, filed on Dec. 6, 2002, now Pat. No. 7,470,941.

(60) Provisional application No. 60/337,066, filed on Dec. 6, 2001.

(51) Int. Cl.
*H01L 21/338* (2006.01)

(52) U.S. Cl. .................. 438/172; 438/285; 438/590; 257/192; 257/194; 257/E21.407; 257/E29.253

(58) Field of Classification Search .......... 438/285, 438/590, 172; 257/192, 194
See application file for complete search history.

(56) References Cited

U.S. PATENT DOCUMENTS

| | | | | | |
|---|---|---|---|---|---|
| 4,733,283 | A | * | 3/1988 | Kuroda | 257/195 |
| 5,373,191 | A | * | 12/1994 | Usagawa et al. | 257/773 |
| 5,705,847 | A | * | 1/1998 | Kashiwa et al. | 257/476 |
| 5,837,570 | A | * | 11/1998 | Asano | 438/172 |
| 5,949,095 | A | * | 9/1999 | Nagahara et al. | 257/192 |
| 6,064,082 | A | * | 5/2000 | Kawai et al. | 257/192 |
| 6,429,467 | B1 | * | 8/2002 | Ando | 257/194 |

FOREIGN PATENT DOCUMENTS

JP 11 274474 A 10/1999

* cited by examiner

*Primary Examiner*—A. Sefer
(74) *Attorney, Agent, or Firm*—Tope McKay & Assoc.

(57) ABSTRACT

A method for fabricating heterojunction field effect transistors (HFET) and a family of HFET layer structures are presented. In the method, a step of depositing a HFET semiconductor structure onto a substrate is performed. Next, a photoresist material is deposited. Portions of the photoresist material are removed corresponding to source and drain pad pairs. A metal layer is deposited onto the structure, forming source pad and drain pad pairs. The photoresist material is removed, exposing the structure in areas other than the source and drain pad pairs. Each source and drain pad pair has a corresponding exposed area. The structure is annealed and devices are electrically isolated. The exposed area of each device is etched to form a gate recess and a gate structure is formed in the recess. Semiconductor layer structures for GaN/AlGaN HFETs are also presented.

42 Claims, 19 Drawing Sheets

| Total gate recess etch time [s] | Sheet Resistance [Ω/square] | Contact Resistance [Ω-mm] | Open Channel Saturation Current [A/mm] |
|---|---|---|---|
| 0 | 208 | 0.34 | 1.9 |
| 10 | 252 | 0.44 | 1.4 |
| 15 | 280 | 0.47 | 1.3 |
| 20 | 361 | 0.46 | 1.2 |

FIG. 14

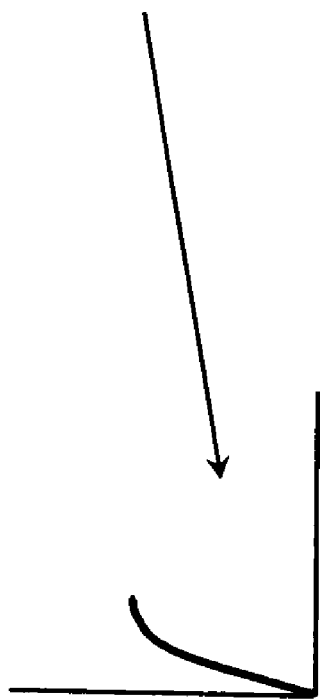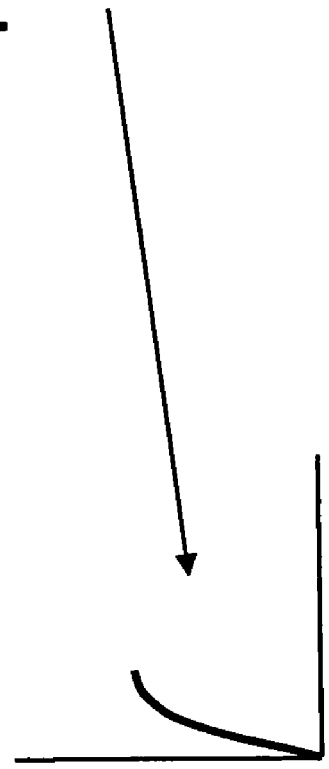

I-V curve of device in the center of the wafer

I-V curve of device at the wafer edge

HFET Layer Structure

| Layer | Composition | Doping | Thickness | Ref |
|---|---|---|---|---|
| doped contact cap layer | GaN : Si<br>$In_xGa_{1-x}N$<br>x=0.01 to 0.1 | n-doped $1.0\times10^{19}$ to $7\times10^{19}$ cm$^{-3}$ | 100-600 Å | 1810b |
| contact AlGaN layer | $Al_xGa_{1-x}N$:Si<br>x=0.15 to 0.45<br>$In_xAl_yGa_{(1-x-y)}N$<br>x=0.01 to 0.1, y=0.15 to 0.5 | n-doped $1.0\times10^{19}$ cm$^{-3}$ | 100 Å to 300 Å | 1810a |
| undoped Schottky barrier layer | $Al_xGa_{1-x}N$, und.<br>x=0.15 to 0.45<br>$In_xAl_yGa_{(1-x-y)}N$<br>x=0.01 to 0.1, y=0.15 to 0.5 | und. | 100 Å to 300 Å | 1808, 1808a |
| channel layer | GaN<br>$In_xGa_{1-x}N$<br>x=0.00 to 0.1 | und. | 50 Å to 1000 Å | 1806 |
| buffer layer | GaN<br>$Al_xGa_{1-x}N$<br>x=0.00 to 0.2 | und. | 1000 Å to 40000 Å | 1804 |
| nucleation layer | AlN | und. | 100 to 300 Å | 1802 |
| | SiC, sapphire, GaN, AlN or any other substrate | | | 1800 |

FIG. 18(a)

HFET Layer Structure

| | | | |
|---|---|---|---|
| contact | GaN : Si<br>InxGa1-xN x=0.01 to 0.1 | n-doped $1.0 \times 10^{19}$ to $7 \times 10^{19}$ cm$^{-3}$ | 100 – 600 Å | 1810b<br>1810a |
| graded contact | graded AlxGa1-xN : Si<br>x graded to 0, In$_x$Al$_y$Ga$_{(1-x-y)}$N<br>x=0.01 to 0.1, y=0.15 to 0.4, y graded to 0 | n-doped $1.0 \times 10^{19}$ to $7 \times 10^{19}$ cm$^{-3}$ | 80 – 200 Å | 1810c |
| contact delta-doped layer | AlxGa1-xN / Si<br>x=0.15 to 0.45, In$_x$Al$_y$Ga$_{(1-x-y)}$N,<br>x=0.01 to 0.1, y=0.15 to 0.5 | n-doped $1.0 \times 10^{12}$ to $3.0 \times 10^{12}$ cm$^{-2}$ sheet charge density repeated 4 times with 3 Å to 5 Å separation between delta doped layers | 4+ repeats, 3.5 Å | 1810 |
| contact doped AlGaN | Al$_x$Ga$_{1-x}$N:Si, x= 0.15 to 0.45 In$_x$Al$_y$Ga$_{(1-x-y)}$N,<br>x=0.01 to 0.1, y=0.15 to 0.5 | n-doped $1.0 \times 10^{19}$ to $7 \times 10^{19}$ cm$^{-3}$ | 50 to 100 Å | 1808a |
| Schottky layer | Al$_x$Ga$_{1-x}$N, und, x= 0.15 to 0.45 In$_x$Al$_y$Ga$_{(1-x-y)}$N,<br>x=0.01 to 0.1, y=0.15 to 0.5 | und. | 150 to 300 Å | 1808b |
| doped AlGaN | Al$_x$Ga$_{1-x}$N:Si, x= 0.15 to 0.45 In$_x$Al$_y$Ga$_{(1-x-y)}$N,<br>x=0.01 to 0.1, y=0.15 to 0.5 | n-doped $1.0 \times 10^{19}$ cm$^{-3}$ | 10 to 20 Å | 1808c |
| spacer | Al$_x$Ga$_{1-x}$N, und, x= 0.15 to 0.45 In$_x$Al$_y$Ga$_{(1-x-y)}$N,<br>x=0.01 to 0.1, y=0.15 to 0.5 | und. | 40 to 95 Å | 1806 |
| channel | GaN, In$_x$Ga$_{1-x}$N, x=0.01 to 0.1 | und. | 50 Å to 1000 Å | 1804 |
| buffer | GaN, Al$_x$Ga$_{1-x}$N, x=0.01 to 0.2 | und. | 1000 Å to 40000 Å | 1802 |
| nucleation layer | AlN | | 10 to 30 Å | 1800 |
| | SiC substrate | | | |

FIG. 18(b)

HIGH POWER-LOW NOISE MICROWAVE GAN HETEROJUNCTION FIELD EFFECT TRANSISTOR

PRIORITY CLAIM

The present application is a Divisional application of U.S. patent application Ser. No. 10/313,374, filed Dec. 6, 2002 now U.S. Pat. No. 7,470,941 at the United States Patent and Trademark Office (USPTO), entitled, "High Power-Low Noise Microwave GaN Heterojunction Field Effect Transistor," which is a non-provisional patent application that claims the benefit of priority to U.S. Provisional Application No. 60/337,066, filed Dec. 6, 2001 at the USPTO, entitled, "High Power-Low Noise Microwave GaN Heterojunction Field Effect Transistor."

BACKGROUND OF THE INVENTION (1) Technical Field

The present invention relates to solid state semiconductor devices. More specifically, the present invention relates to a GaN/AlGaN heterojunction field effect transistor and a method for making such transistors.

(2) Discussion

GaN/AlGaN High Electron Mobility Transistors (HEMTs) are important for the creation of devices such as robust low noise amplifiers as well as high-power, low weight, microwave sources and Microwave/Millimeter-wave Monolithic Integrated Circuit (MMICs) that operate in the X-band. Microwave sources weighing only a few grams fabricated from GaN/AlGaN/SiC HEMTs can potentially deliver hundreds of Watts of microwave power at 10 GHz, and are formed, and a photoresist is applied, forming a mask with areas exposed for future deposition of source and drain pads of an ohmic metal. Prior to the deposition of metal, an etching process is performed to remove portions of the semiconductor layer structure where the source and drain pads will be deposited. The photoresist material functions to shield a portion of the surface of the semiconductor layer structure during this etching process. After etching, an ohmic metal layer is applied to the entire surface of the semiconductor layer structure. The photoresist is then removed to eliminate deposited metal from the masked areas. After the photoresist has been removed, the device is annealed and a gate recess is etched through the exposed area to a desired depth. A gate is then added to the device and individual devices are then isolated.

In this process, a mesa is formed due because of the protection afforded by the photoresist material during the etching process. Further, the etching process results in a portion of the photoresist material being removed so that the top of the photoresist material "overhangs" the lower portion. During the deposition of the ohmic metal, this overhang results in portions of the etched area (thinned parts of the Schottky barrier) that are not completely covered by ohmic metal. As a result, the mobile two-dimensional electron gas (2DEG) charge is reduced underneath these thinned unprotected parts of the Schottky barrier due to surface depletion. Also, photoresist material residues are generally left after the ohmic metal is lifted off (by removal of the photoresist material). During the annealing process, these residues tend to melt and flow, leaving residues on the active area of the device. During the subsequent addition of the gate, these residues are buried. Impurities underneath the gate metal generally adversely affect the performance of the resulting transistor devices. This baseline process and an example of a resulting structure are described in much greater detail as follows.

A GaN HEMT layer structure generated by the baseline process shown in FIG. 1, comprises a substrate 100, a 10 to 20 nm thick AlN or $AlyGa_{(1-y)}N$ nucleation layer 102, a 250 to 400 nm thick GaN layer 104, and 10 to 40 nm thick strained AlGaN Schottky barrier layer 106. In the structure shown, the desirable Al content x in a ternary $Al_xGa_{(1-x)}N$ Schottky barrier layer could be any value between 0.1 and 0.4. For the purpose illustration, a value of 0.3 for x and a Schottky barrier thickness of 30 nm are selected. The 2DEG charge at the AlGaN/GaN interface is obtained by piezoelectric and spontaneous polarization caused by lattice mismatch induced strain between GaN and AlGaN Schottky barrier layer, and not by doping. The electron charge density is roughly proportional to Al content x in the Schottky barrier layer (affecting strain) and thickness of the Schottky barrier (affecting the surface charge depletion effect). The best combination of the 2DEG sheet charge and the specific ohmic contact resistance is obtained for x values between 0.15 and 0.3 and Schottky barrier thickness between 20 nm and 40 nm. The upper value of the x and the thickness of the Schottky barrier are limited by the fact that barriers with an x value higher than 0.3 give poor ohmic contacts, and that strained barriers thicker than 40 nm cannot be grown due to strain relaxation.

After the semiconductor layer structure described above has been formed on the substrate, the baseline technique first defines source contact pad areas 200, and drain contact pad areas 202 are defined into a photoresist material 204 using image reversal process, as depicted in FIG. 2. In this figure, a typical layout of source pad areas 200 and drain pad areas 202 of a GaN power HEMT is presented. The source-drain separation depicted in this baseline process is 2 μm. The image reversal process is used to obtain undercut of the photoresist profile as shown in FIG. 3. As shown, a photoresist ledge 300 is created by the undercut, acting as a shadow mask during high vacuum metal evaporation and preventing metal from depositing onto the resist sidewalls 302. The resist profile undercut caused by this process is in the neighborhood of 0.25 μm. A scanning electron microscope (SEM) image of an example of such a photoresist profile is depicted in FIG. 4.

During the next fabrication step, areas unprotected by the photoresist material are etched by chlorine plasma in a reactive ion etching (RIE) system to reduce Schottky barrier thickness underneath the subsequently deposited contact metal. This step is called an ohmic recess etch, and regions in which Schottky barrier is etched are called recessed areas. Ohmic contact resistance is minimized when Schottky barrier underneath the ohmic metal is thinned between 7.5 nm and 10 nm. By using an ohmic recess etch process, 2DEG sheet charge is reduced only in recessed areas, which are subsequently covered by ohmic metal and converted by chemical reaction with metal during a high temperature annealing step into a highly conductive heavily n-typed doped material. The cross-section of device structure after this fabrication step is shown in FIG. 5. The protected area of the AlGaN layer 500 under the photoresist material 204 forms a mesa 502.

After ohmic recess etch, the wafer is loaded into a high vacuum e-beam evaporator, and ohmic metals 600 are evaporated onto the structure, a cross-section of which is presented in FIG. 6. This figure also illustrates how this process results in incomplete metal coverage of the recessed areas 602, which is a major flaw. The recessed areas 602 not covered by the ohmic metal are termed unprotected recess areas. The unprotected recessed areas 602 have adverse effects on performance and reliability of GaN HEMT's because the 2 DEG sheet charge in unprotected recessed areas is too low to support the high current densities typical for GaN HEMT's. It is reasonable to assume that high electric fields and electron velocity saturation arise in these areas at high current densities, just as they do underneath the gate of the device. The presence of the second high field region in a HEMT degrades frequency response, power-added efficiency, and power handling capability of the device. It also contributes to needless heating of the device and hence accelerates device degradation. Device performance would be improved by elimination of the unprotected recessed areas.

The photoresist is lifted-off by soaking in a photoresist stripper followed by rinsing in de-ionized water. FIG. 7 shows an SEM image of ohmic metal and the source drain region of the device after the lift-off. This image clearly reveals that the recessed areas are not completely covered by the metal; moreover, it also shows that photoresist residues are not completely removed during this lift-off process. The presence of photoresist residues after ohmic metal lift-off is the second major weakness of this lift-off process. These residues are always present on devices created by this process. Attempts to remove the residues by extended soaking in the photoresist stripper are unsuccessful. More aggressive photoresist strippers can be used, but they attack the ohmic metal as well, resulting in degraded, or possibly non-functional, devices.

The fabrication of ohmic contacts is concluded by a rapid thermal anneal (RTA) in a nitrogen ambient. During this high temperature anneal, according to current theories of n-type GaN ohmic contacts, an AlTiN contact alloy with a low Schottky barrier height-to-n-type AlGaN transition area is formed by a chemical reaction between ohmic metal and under-laying semiconductor films. The formation of ohmic contacts is facilitated by the fact that GaN and AlGaN layers underneath the ohmic metal are due to loss of nitrogen converted to heavy n-type material, as nitrogen vacancies are donors in these III-V semiconductors. In FIG. 8 the device cross-section after RTA is shown with contacts 800 and transition areas 802 indicated. The electrical properties of GaN HEMT layers not covered by the ohmic metal during high temperature anneal are, due to absence of chemical reaction, not significantly altered during this step. In FIG. 9, a SEM image of the ohmic metal contacts and the source to drain region of an alloyed device is shown. This image reveals that the photoresist residues of FIG. 7 melt and flow during the high temperature annealing process and leave residues in the active area of the device. These residues get buried underneath the gate metal during subsequent processing steps. It is well-known that impurities underneath the gate metal adversely affect performance of field effect transistors (FETs).

A need exists in the art to overcome these limitations and to provide a method for fabricating GaN/AlGaN HEMTs that do not suffer from the limitations imposed by these unprotected recessed areas and residue problems.

SUMMARY

The present invention provides a semiconductor layer structure for a GaN/AlGaN heterojunction field effect transistor comprising a substrate; a nucleation layer formed on the substrate, the nucleation layer formed of AlN; a buffer layer formed on the nucleation layer, the buffer layer comprised of a material selected from a group consisting of GaN and AlGaN; a channel layer formed on the buffer layer, the channel layer comprised of a material selected from a group consisting of GaN and InGaN; an Schottky barrier layer structure formed on the channel layer, the Schottky layer structure comprising: an undoped Schottky layer comprised of a material selected from a group consisting of AlGaN and InAlGaN; a contact layer structure formed on the Schottky barrier structure, the contact layer structure comprising: a first contact layer formed on the undoped Schottky barrier layer, the first contact layer formed of a compound of materials selected from a group consisting of AlGaN and InAlGaN; and a doped contact cap layer formed on the first contact layer, the doped contact layer formed of a compound of materials selected from a group consisting of GaN and InGaN.

In one aspect, the doped contact cap layer is n-doped to approximately between $1 \times 10^{19}$ cm$^{-3}$ and $7 \times 10^{19}$ cm$^{-3}$. In another aspect, the doped contact cap layer has a thickness approximately between 100 to 600 Å. In yet another aspect, the doped contact cap layer is formed of $In_xGa_{1-x}N$, where x is approximately between 0.0 and 0.1. In a still further aspect, the first contact layer is n-doped to approximately between $1 \times 10^{19}$ cm$^{-3}$ and $7 \times 10^{19}$ cm$^{-3}$.

In another aspect, the first contact layer has a thickness approximately between 50 to 300 Å. In yet another aspect, the first contact layer is formed of $In_xAl_yGa_{1-x-y}N$, where x is approximately between 0.0 and 0.1 and y is approximately between 0.0 and 0.5.

In a further aspect, the undoped Schottky layer has a thickness approximately between 100 to 300 Å. In a yet further aspect, the undoped Schottky layer is formed of $In_xAl_yGa_{1-x-y}N$, where x is approximately between 0.0 and 0.1 and y is approximately between 0.15 and 0.5.

In another aspect, the channel layer has a thickness approximately between 50-1000 Å. In still another aspect, the channel layer is formed of $In_xGa_{1-x}N$, where x is approximately between 0.0 and 0.1.

In yet another aspect, the buffer layer has a thickness approximately between 1000-40,000 Å. In a yet further aspect, the buffer layer is formed of $Al_xGa_{1-x}N$, where x is approximately between 0.0 and 0.2.

In an additional aspect, the nucleation layer has a thickness approximately between 100 to 300 Å. In a still additional aspect, the nucleation layer is formed of AlN.

In a further aspect, the substrate is formed of a material selected from a group consisting of SiC, sapphire, GaN, and AlN.

In another aspect, the Schottky layer structure further comprises, between the undoped Schottky layer and the channel layer, a doped Schottky layer and a spacer Schottky layer, with the doped Schottky layer adjacent the undoped Schottky layer and the spacer Schottky layer formed between the doped Schottky layer and the channel layer. In a still further aspect, the doped Schottky layer is formed of a material selected from the group consisting of AlGaN and InAlGaN. In another aspect, the doped Schottky layer is n-doped to approximately between $1 \times 10^{19}$ cm$^{-3}$ and $7 \times 10^{19}$ cm$^{-3}$. In yet another aspect, the doped Schottky layer has a thickness approximately between 10 to 20 Å. In an additional aspect, the doped Schottky layer is formed of $In_xAl_yGa_{1-x-y}N$, where x is approximately between 0.0 and 0.1 and y is approximately between 0.15 and 0.5.

In another aspect, the spacer Schottky layer is formed of a material selected from the group consisting of AlGaN and InAlGaN. In a still further aspect, the spacer Schottky layer has a thickness approximately between 40 to 95 Å. In still another aspect, the spacer Schottky layer is formed of $In_xAl_yGa_{1-x-y}N$, where x is approximately between 0.0 and 0.1 and y is approximately between 0.15 and 0.5.

In a further aspect, the first contact layer is graded such that y varies gradually from 0.5 to 0.0 from an interface with the doped contact top layer and the undoped Schottky layer.

An another aspect, the invention further comprises a contact delta-doped layer formed between the first contact layer and the undoped Schottky layer, the contact delta-doped layer formed of a plurality of sublayers. In yet another aspect, each of the sublayers of the delta-doped layer is comprised of a material selected from a group consisting of AlGaN and InAlGaN. In still another aspect, each of the sublayers of the delta-doped layer is formed of $In_xAl_yGa_{1-x-y}N$, where x is approximately between 0.0 and 0.1 and y is approximately between 0.15 and 0.5. In an additional aspect, each sublayer of the contact delta-doped layer has a sheet density of approximately between $1\times10^{12}$ and $3\times10^{12}$ cm$^{-2}$. In a further aspect, each of the sublayers of the delta-doped layer has a separation of approximately between 3 and 5 Å. In an additional aspect, the delta-doped layer is comprised of four sublayers.

In a further aspect, the semiconductor layer structure further comprises a source contact pad and a drain contact pad, and wherein a gate is formed in contact with the Schottky layer structure such that the source contact pad, the drain contact pad, and the gate are electrically isolated from each other, forming a transistor device.

In a still further aspect, a passivation layer is formed on the transistor device. In another aspect, the passivation layer is comprised of a dielectric material. In yet another aspect, the passivation layer is comprised of SiN.

The present invention further comprises a method for fabricating heterojunction field effect transistors (HFET) comprising steps of: depositing a HFET semiconductor structure onto a substrate; depositing a photoresist material onto the HFET semiconductor structure; selectively removing portions of the photoresist material corresponding to source pad and drain pad pairs; depositing a metal layer onto the HFET semiconductor structure so that the metal is in direct contact with the HFET semiconductor structure, forming source pad and drain pad pairs; removing the photoresist material to expose the semiconductor structure in areas other than the source pad and drain pad pairs, with each source pad and drain pad pair having a corresponding exposed area; annealing the HFET semiconductor structure; electrically isolating devices, with each device comprising a source pad and drain pad pair and a corresponding exposed area; removing a further portion of the HFET semiconductor structure in the exposed area of each device to form a gate recess, such that the source pads and drain pads act as masks to protect areas of the HFET semiconductor structure thereunder; and forming a gate structure in the area of each gate recess such that the gate structure is electrically isolated from direct contact with source pad and the drain pad, thereby resulting in transistor devices.

In another aspect, the step of depositing a metal layer onto the HFET semiconductor structure is performed by depositing a titanium layer followed by an aluminum layer followed by layers selected from a group consisting of a platinum layer, and a nickel layer followed by a gold layer. In yet another aspect, the step of depositing the metal layer onto the HFET semiconductor structure is performed as an ohmic metal deposition by evaporation. In a still further aspect, the titanium layer is between 100 and 200 Å thick, the aluminum layer is between 1000 and 2000 Å thick, the nickel layer is between 200 and 1000 Å thick, the gold layer is between 1000 and 2000 Å thick, and the platinum layer is between 500 and 2000 Å thick.

In another aspect, the step of annealing is performed in a reactively neutral environment. In a still further aspect, the step of annealing is performed in an environment selected from a group consisting of substantially non-reactive gases and a substantial vacuum. In yet another aspect, the substantially non-reactive gases are selected from a group consisting of nitrogen and noble gases. In another aspect, the step of annealing is performed for approximately 30 seconds at a temperature approximately between 600 and 900 degrees Celsius.

In a further aspect, the step of electrically isolating devices is performed by a process selected from the group consisting of mesa etching between devices to physically isolate the devices and ion implanting an area about each device to isolate each device with a substantially non-conductive barrier.

In a still further aspect, the step of removing a further portion of the HFET semiconductor structure in the exposed area of each device is performed iteratively. In yet another aspect, the HFET semiconductor structure comprises an n-doped region and a undoped region, with the undoped region formed on the substrate and the n-doped region formed on the undoped region opposite the substrate, and wherein the step removing a further portion of the HFET semiconductor structure in the exposed area of each device is performed to remove the n-doped region in the exposed area of each device, and to form a gate recess. In a further aspect, between iterative steps, measurements of the sheet resistance are taken in the gate recess to determine when the sheet resistance in the gate recess corresponds to a sheet resistance of the undoped region, and when the sheet resistance in the gate recess corresponds to a sheet resistance of the undoped region, the iteration is stopped. In a still further aspect, the step of removing a further portion of the HFET semiconductor structure is performed by a process selected from a group consisting of reactive ion etching and wet chemical etching. In still another aspect, the process is chlorine reactive ion etching. In a yet further aspect, the gate structure is formed in a substantially t-shaped manner. In an additional aspect, the gate structure is formed of a metal layer combination selected from a group consisting of nickel/gold, platinum/titanium/gold, tungsten/titanium/gold, tungsten/aluminum, tungsten silicide/aluminum, and tungsten silicide/titanium/gold, where the first metal in each layer combination is the first deposited.

In another aspect, the invention comprises a further step, between the steps of removing the photoresist and annealing, of depositing a creep-prevention layer such that it covers at least a portion of each source pad and drain pad pair and a portion of each corresponding exposed area such that the creep-prevention layer prevents creep of the source pad and drain pad into the corresponding exposed area during the step of annealing. In yet another aspect, the creep-prevention layer is formed of a material selected from a group consisting of silicon nitride and silicon dioxide.

In a still further aspect, in the step of removing a further portion of the HFET semiconductor structure, the creep-prevention layer is removed.

In yet another aspect, the method comprises a further step of forming a passivation layer on the transistor devices. In an additional aspect, the passivation layer is formed of a dielectric material. In a further aspect, the passivation layer is formed of silicon nitride.

BRIEF DESCRIPTION OF THE DRAWINGS

The objects, features and advantages of the present invention will be apparent from the following detailed descriptions of the preferred aspect of the invention in conjunction with reference to the following drawings.

FIG. 14 is a table containing example TLM measurements and open channel saturation current measurements obtained during a gate recess etching step;

FIG. 15($a$) is a graph depicting the open channel saturation current in the center of a wafer of the described HFET after gate recess etching;

FIG. 15($b$) is a graph depicting the open channel saturation current at the edge of a wafer of the described HFET after gate recess etching;

FIG. 16($b$) is an example of a reverse bias I-V characteristic of the Schottky gate of a device fabricated by the method of the present invention;

FIG. 17($b$) is an example of an I-V characteristic of the Schottky gate of a device fabricated by the method of the present invention, taken at the edge of a wafer;

FIG. 18($a$) is a layer diagram/table depicting a relatively simple family of layer structures of the present invention that may be used for fabricating GaN/AlGaN HFETs; and FIG. 18($b$) is a layer diagram/table depicting a more detailed family of layer structures of the present invention that may be used for fabricating GaN/AlGaN HFETs.

DETAILED DESCRIPTION

Figure 1:
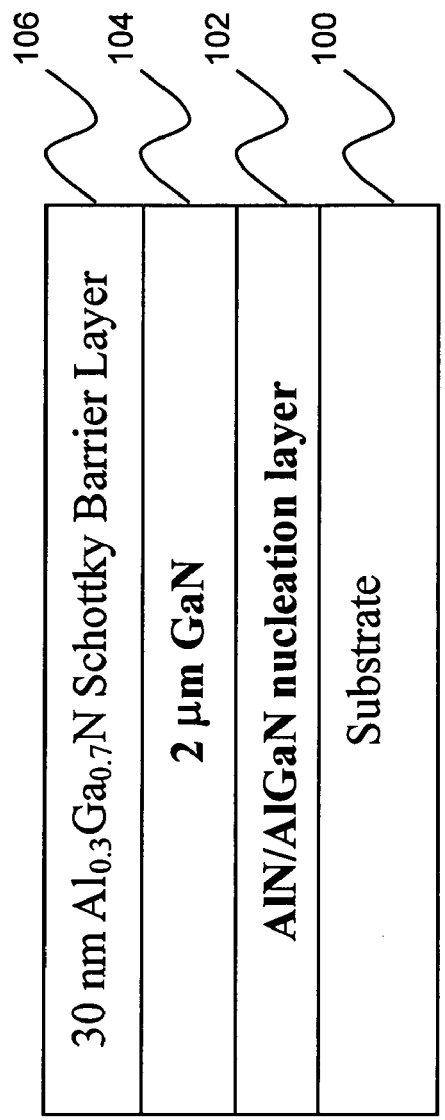
FIG. 1 is a layer diagram of an example GaN HEMT layer structure used for in a baseline method that is provided for comparison with the present invention.

The present invention relates to solid state semiconductor devices. More specifically, the present invention relates to a GaN/AlGaN heterojunction field effect transistor and a method for making such transistors. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein, may be applied to a wide range of aspects. Thus, the present invention is not intended to be limited to the aspects presented, but is to be accorded the widest scope consistent with the principles and novel features disclosed herein. Furthermore it should be noted that unless explicitly stated otherwise, the figures included herein are illustrated diagrammatically and without any specific scale, as they are provided as qualitative illustrations of the concept of the present invention.

This discussion will be divided into two sections. The first is a discussion of the process aspect of the present invention. The second section focuses on devices that may be created by this process and the specifications for the materials that are used in the devices.

(1) The Process Aspect

The process aspect of the present invention provides an improved technique for fabricating Ga/AlGaN high electron mobility transistors (HEMTs). Several noteworthy aspects of this invention include: the creation of epitaxial device structures using the fabrication process flow taught herein, use of ohmic metal as a mask for gate recess etch, use of a nitride layer to protect the ohmic metal edge (thus serving as a mask gate recess etch).

The present invention improves access resistance, yield, and reliability, power, performance, and microwave low noise performance of GaN/AlGaN HEMT's, and reduces the fabrication cost of GaN/AlGaN HEMT's, because it reduces the number of processing steps. The process presented reduces ohmic contact resistance of GaN HEMT by more than a factor of two over current process known to the inventors. It also improves uniformity of ohmic contact resistance across the wafer. Additionally, it improves uniformity of device I-V characteristics across a wafer. Lower contact resistance results in improved frequency response, noise figure, power-added efficiency, and power handling capability of the device. It also decreases device heating, hence improving device reliability. The process of the present invention also produces devices with broader gm curves than our current process, which aids in improving device linearity. Another advantage of the described process is that it can be used to fabricate on the same wafer, in a controlled manner, devices with fine tuned, but different values of pinch-off voltage. This can be done by selectively protecting certain devices during the gate recess etching step. The described process also eliminates photoresist residues in the source-drain region, which additionally improves device performance. Next, a detailed discussion of the method of the present invention is provided.

Figure 10:
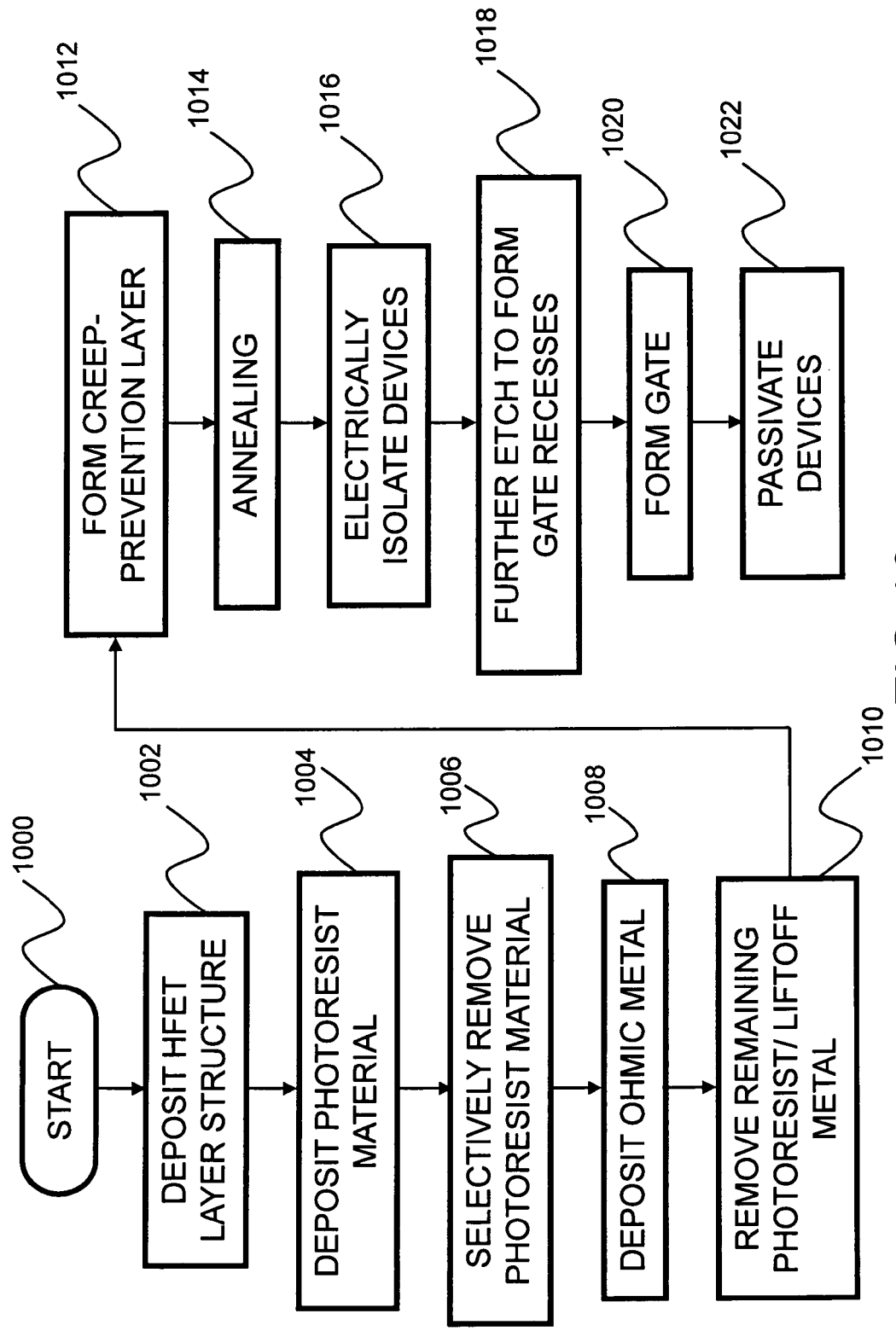
FIG. 10 is a flow chart depicting the steps in the method of the present invention.

The process described herein will simplify fabrication of ohmic contacts, will eliminate ohmic recess etch step, will eliminate photoresist residues, will reduce contact resistance of the ohmic metal, and will improve yield and uniformity. A flow chart of the steps in the method of the present invention is presented in FIG. 10.

It is important to note that the method described can be applied to any HFET semiconductor structure, and that any discussion tailored to a specific structure is simply for the purpose of providing a more concrete, but non-limiting, example for the reader. In addition to the particular exemplary structures mentioned in this description of the method of the present invention, other specific and novel structures will be presented in the section below regarding devices of the present invention.

After starting 1000, the first step in the method of the present invention is the deposition of a HFET semiconductor structure onto a substrate 1002. In one aspect, this step involves the deposition of a GaN high electron mobility transistor (HEMT) semiconductor structure onto sapphire or semi-insulating SiC (or any other compatible) substrate, generally by either Molecular Beam Epitaxy (MBE) or by Metal Organic Chemical Vapor Deposition (MOCVD). The example HEMT structure shown in FIG. 11 consists of, staring at the substrate 1100, a 10 to 20 nm AlN or AlGaN nucleation layer 1102, a 250 to 4000 nm thick GaN layer 1104, a 10 to 30 nm thick undoped $Al_xGa_{1-x}N$ layer 1106, and a 10 to 30 nm thick n-type doped layer of $Al_yGa_{1-y}N$ 1108. Values of x and y, which set the content of Al may be equal or different (for example, x could equal 0.4 and y could equal 0.2). For purpose of example, an equal value for x and y of x=y=0.3 is selected herein. In any case, it is desirable that x and y be selected with values between 0.1 and 1.0. The element used for n-doping is generally silicon. As an example, the level of incorporated silicon in the $Al_yGa_{1-y}N$ layer 1108 is in the range of $5\times10^{17}$ to $1\times10^{21}$ $cm^{-3}$. The structure further comprises a 5 to 30 nm thick Si-doped $Al_zGa_{1-z}N$ layer 1110 that is graded from z=y to z=0. The structure is capped by 5 to 100 nm thick GaN layer 1112 that is doped with Si in a range similar to that of the $Al_yGa_{1-y}N$ layer 1108. In an alternative structure, parts of this layer could be left undoped.

In addition to the layers just discussed, an etch stop layer (not shown) could be inserted between the $Al_xGa_{1-x}N$ layer 1106 and the $Al_yGa_{1-y}N$ layer 1108. The etch stop layer could, for example, be formed of an AlGaN compound with Al content significantly higher or lower than the x and y values selected for the $Al_xGa_{1-x}N$ layer 1106 and the $Al_yGa_{1-y}N$ layer 1108, depending on the etching chemistry that is used for gate recess etching. If the recess etch process preferentially removes high Al content layers, a low Al content etch stop layer is used, while high Al content etch stop layers are used for etching processes that preferentially remove low Al content layers. In this structure, a mobile two dimensional electron gas (2DEG) charge is induced at the interface between the GaN layer 1104 and $Al_xGa_{1-x}N$ layer 1106. Ohmic contact formation on this structure is facilitated by the heavily Si-doped GaN contact layer 1112, and by the selected grading scheme (if any) of the $Al_zGa_{1-z}N$ layer 1110.

Figure 2:
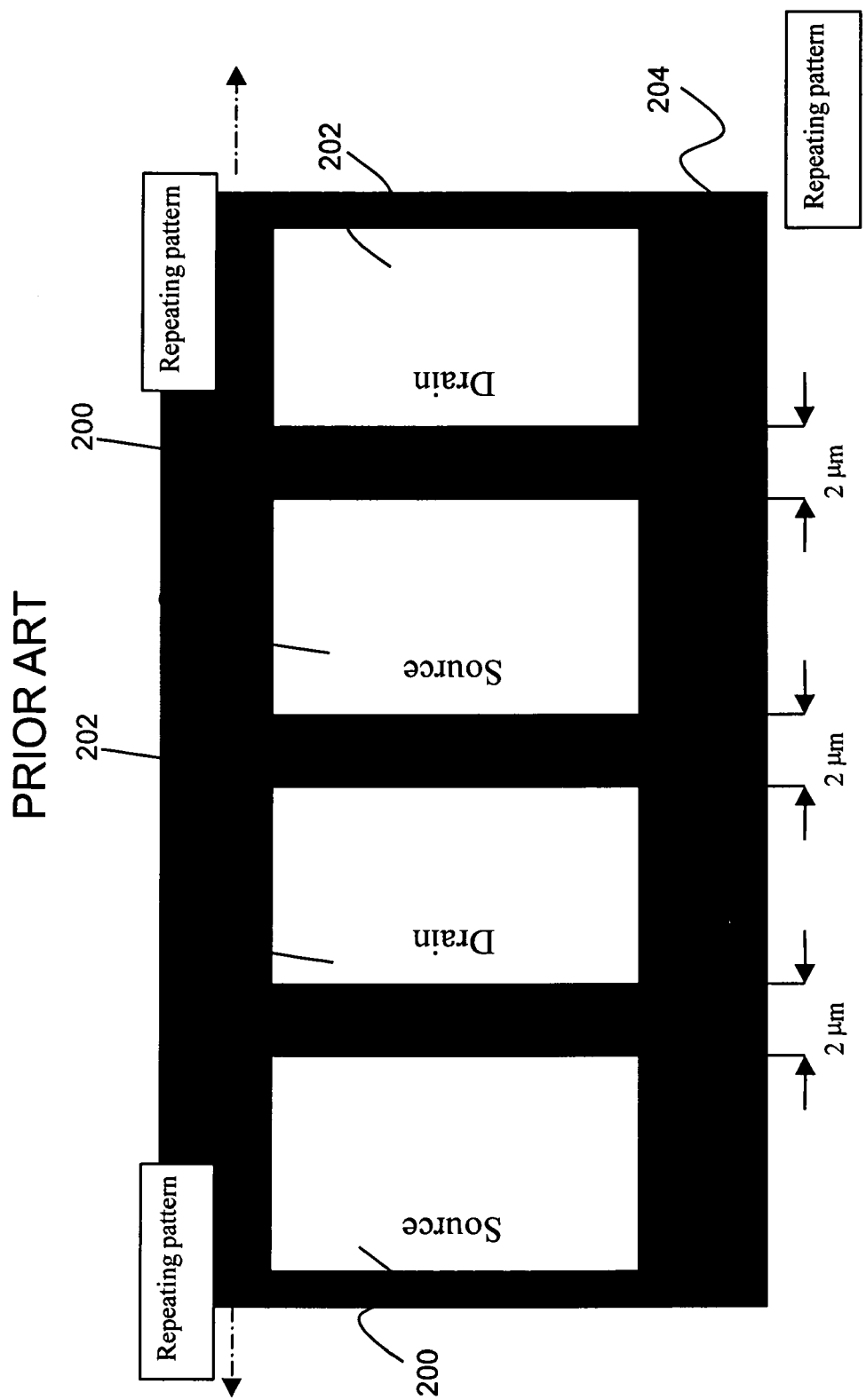
FIG. 2 is an illustrative diagram of an example of a HFET layer structure covered with a photoresist material with the photoresist removed in areas for source and drain pads.
Figure 3:
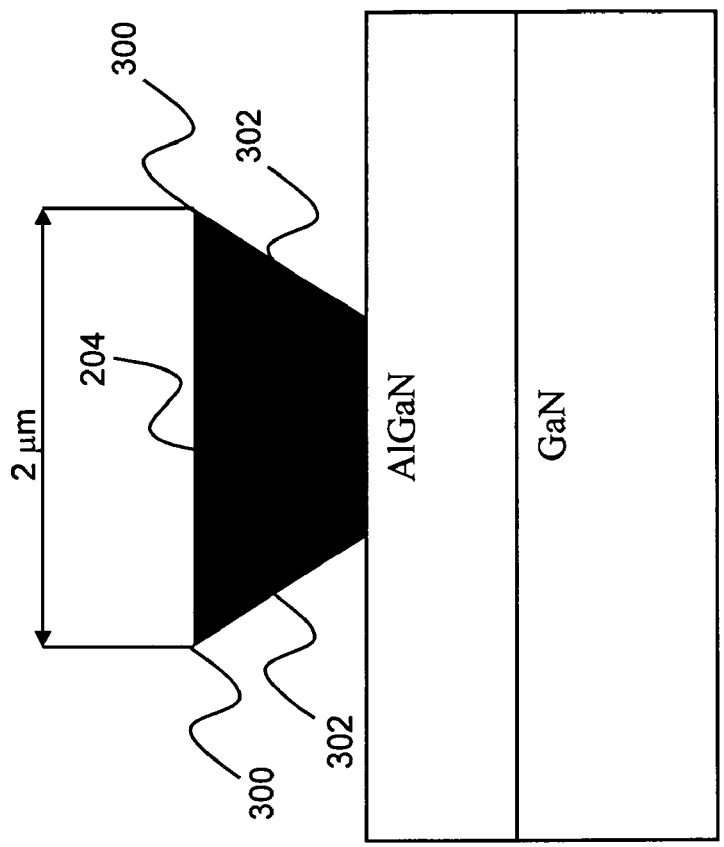
FIG. 3 is a cross-sectional illustrative diagram of the HFET layer structure of FIG. 2, depicting the photoresist ledge created in the baseline method.
Figure 4:
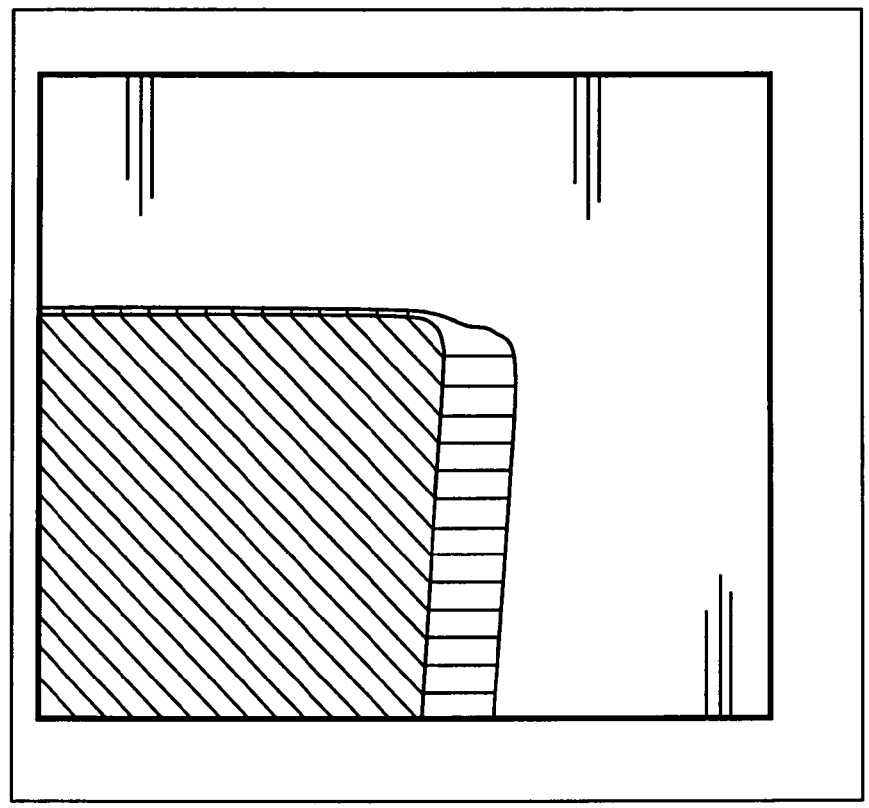
FIG. 4 is a scanning electron microscope (SEM) image of an example photoresist profile created in the baseline method.
Figure 5:
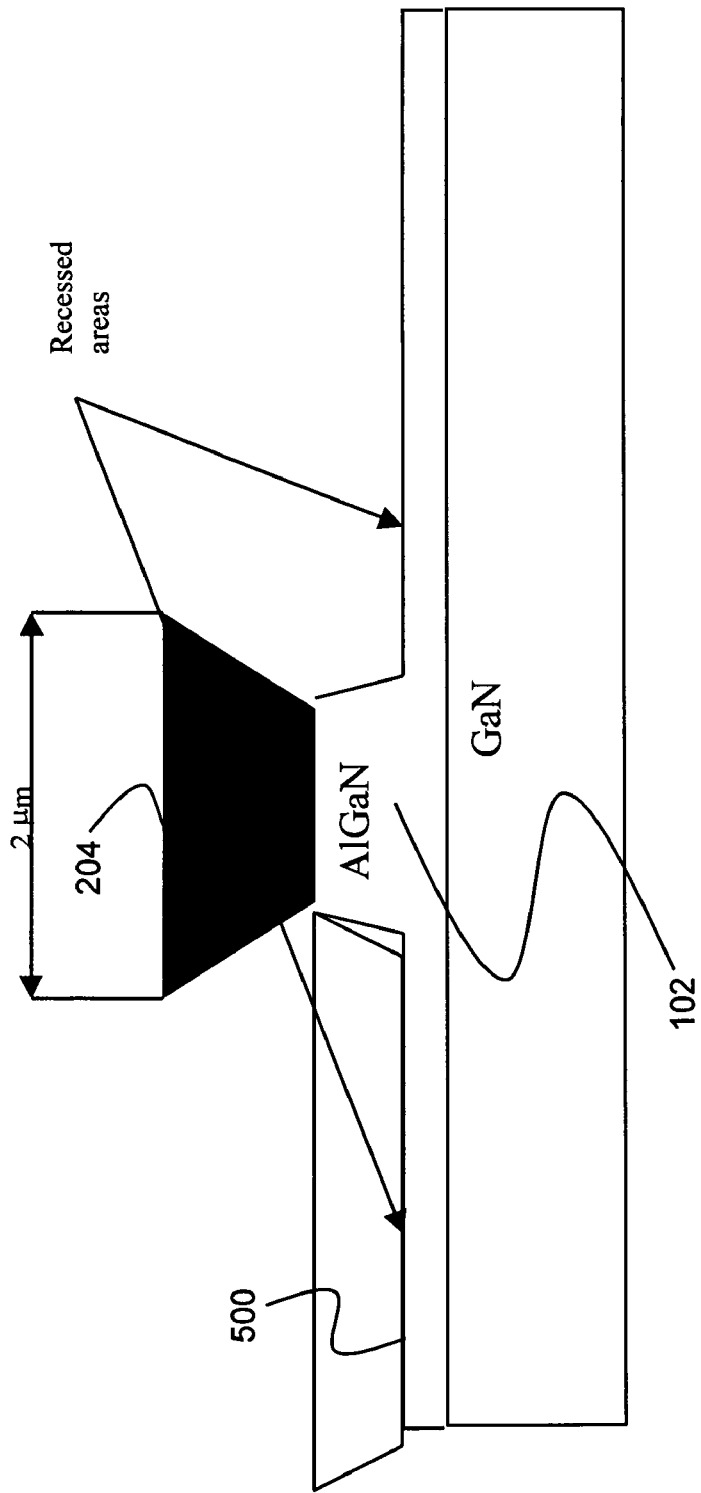
FIG. 5 is a cross-sectional illustrative diagram of the HFET layer structure of FIG. 3, depicting the photoresist ledge created in the baseline method after etching the Schottky barrier layer.
Figure 6:
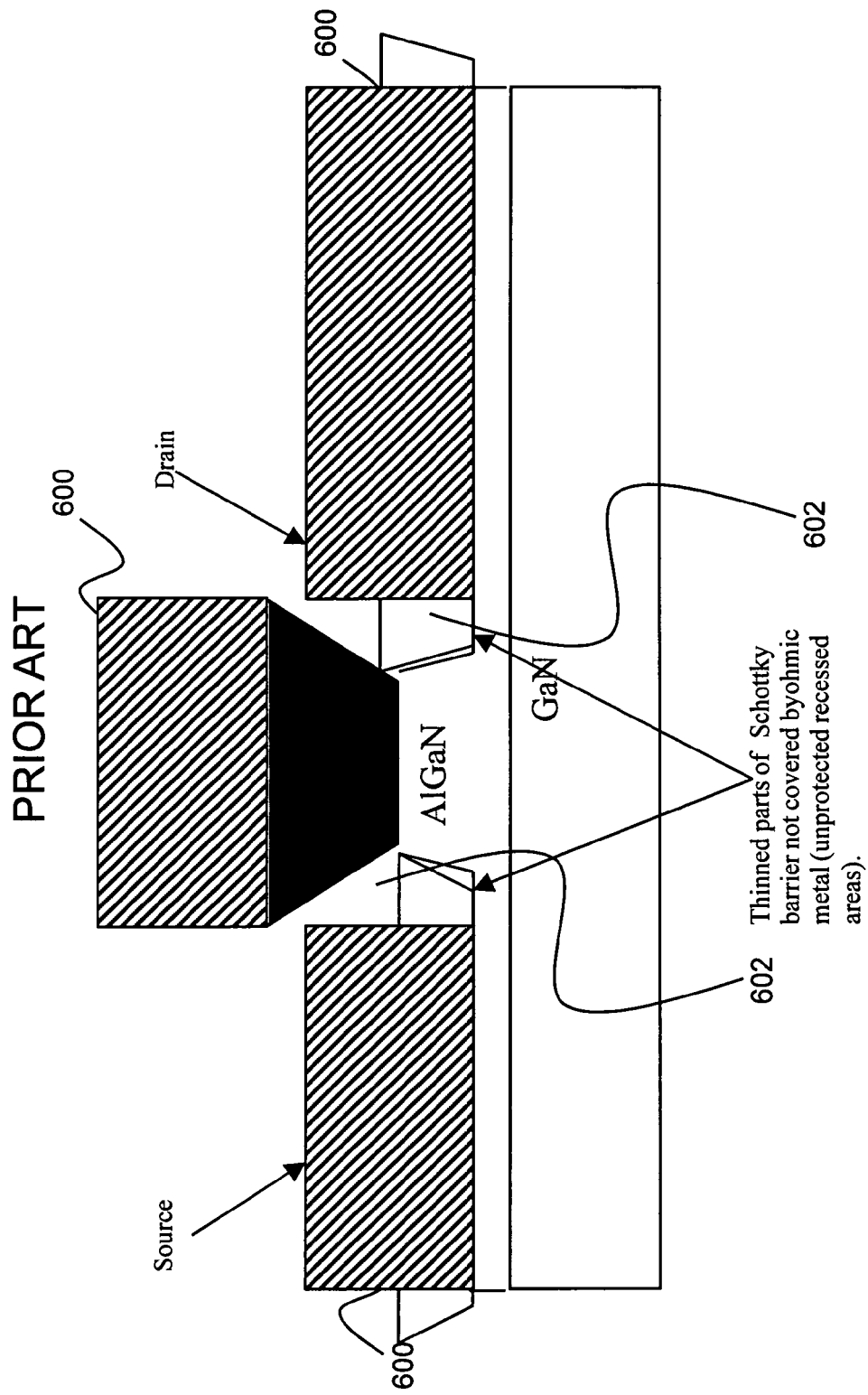
FIG. 6 is a cross-sectional illustrative diagram of the HFET layer structure of FIG. 5, depicting the effect of the photoresist ledge during the step of evaporating metal onto the layer structure.
Figure 7:
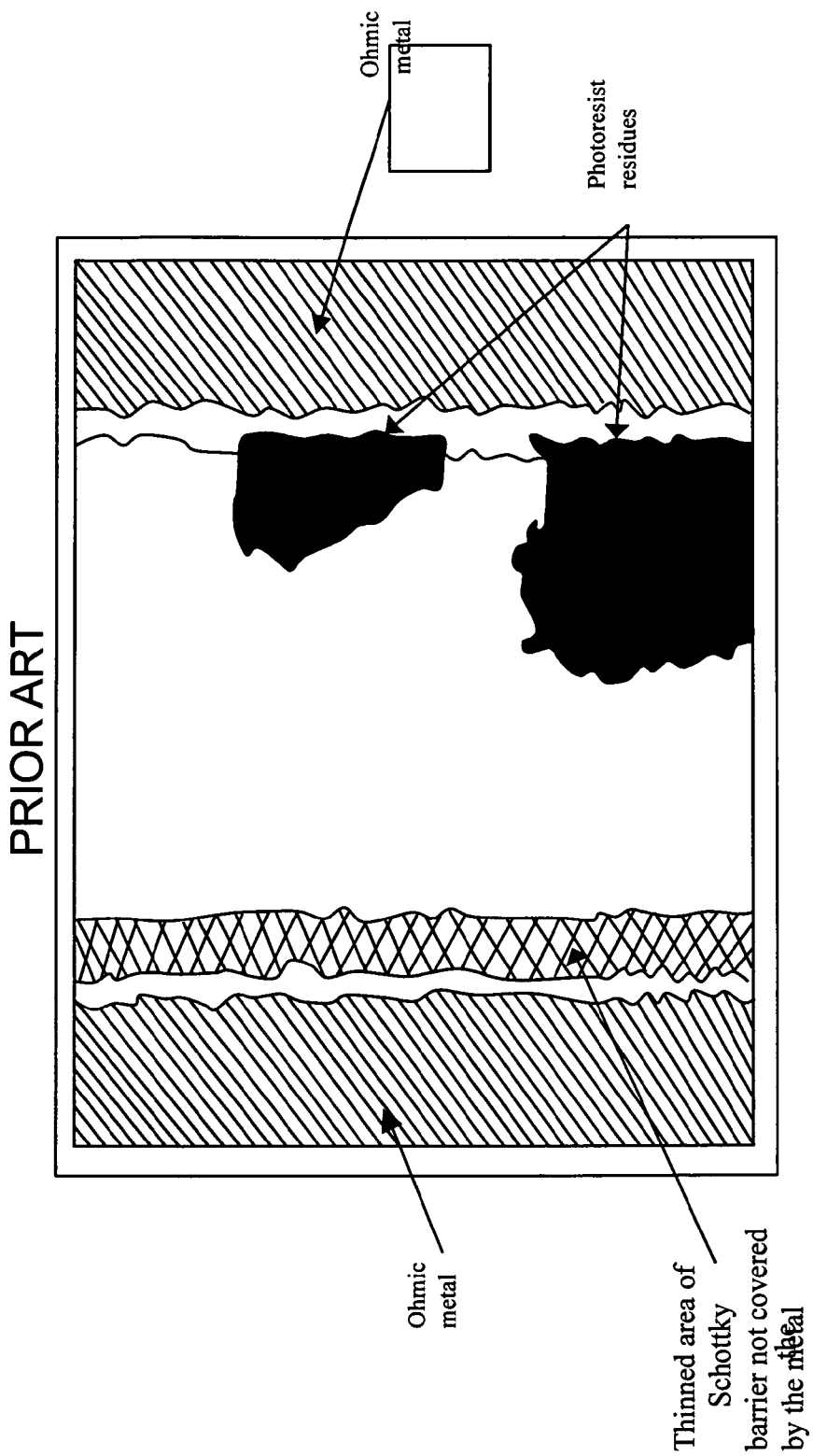
FIG. 7 is a SEM image of ohmic metal and the source-drain region of the HFET after metal lift-off, demonstrating that the recessed areas are incompletely covered by the metal.
Figure 8:
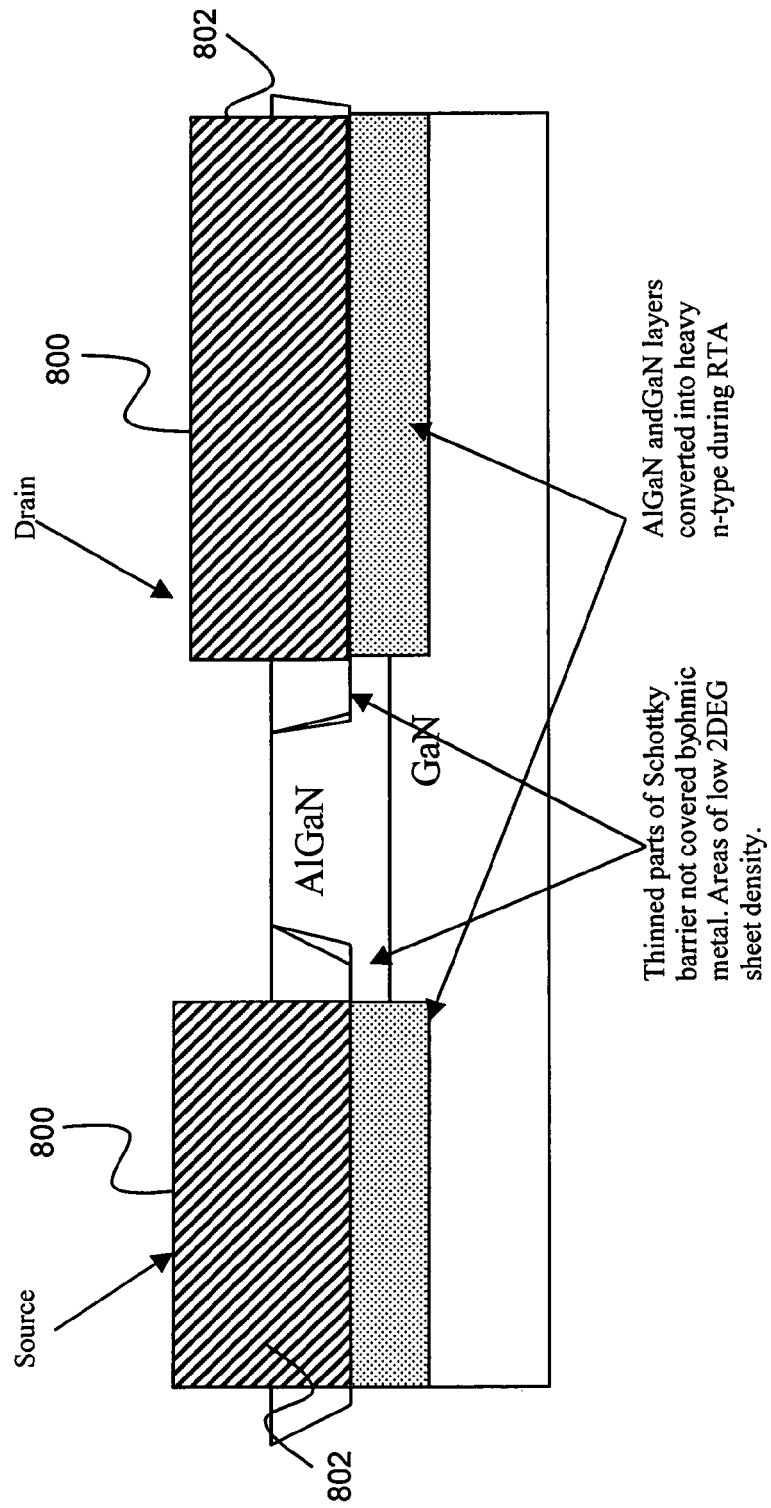
FIG. 8 is a is a cross-sectional illustrative diagram of the HFET layer structure of FIG. 7, depicting the effect of the annealing step.
Figure 9:
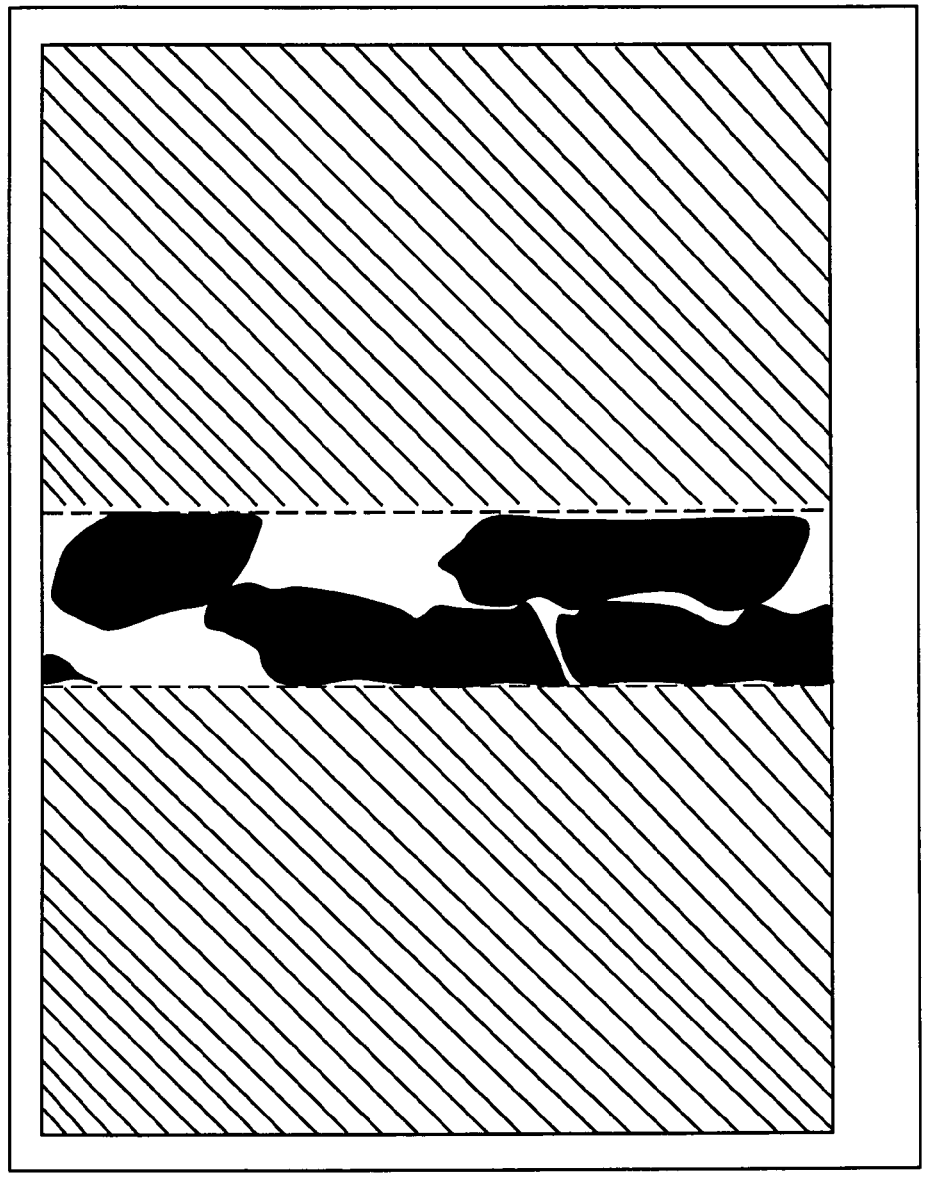
FIG. 9 is a SEM image of the ohmic metal contacts and the source-drain region after annealing, demonstrating how the photoresist residues of FIG. 7 melt and flow during the high-temperature annealing step and leave residues in the active area of the device.
Figure 11:
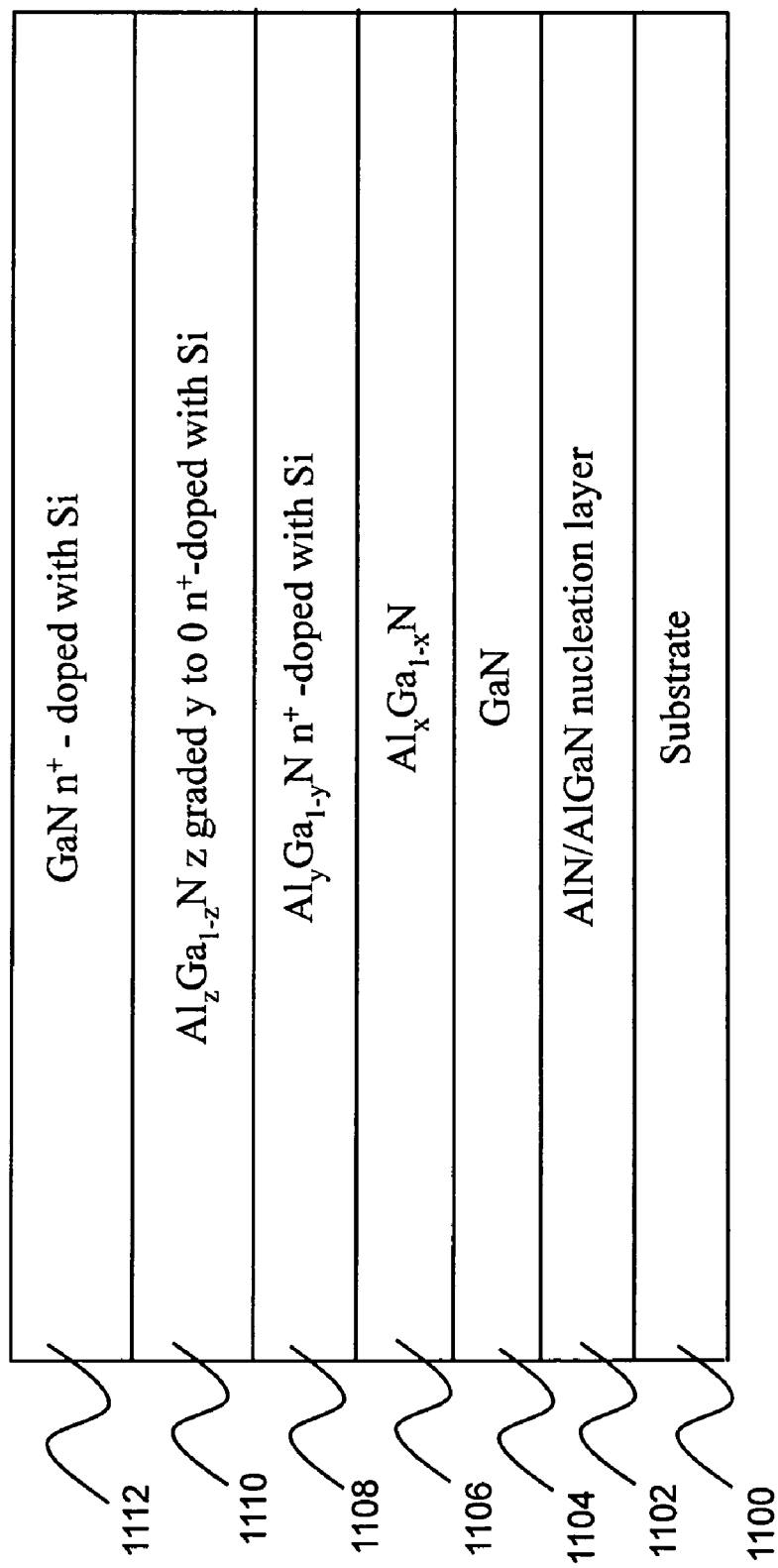
FIG. 11 is a layer diagram of an example HEMT structure used during the description of the method of the present invention.

After the semiconductor layer structure is formed as shown in FIG. 11, a step of depositing a photoresist material onto the HFET semiconductor structure 1004 is performed. In this step, a photoresist material is patterned to define source pad and drain pad pair areas on the semiconductor structure. The source pad and drain pad pair areas are typically prepared for ohmic metal liftoff using an image-reversal process. In this process, portions of the photoresist material that correspond to source pad and drain pad locations are selectively removed in a selective removal step 1006. The resulting surface is similar in profile to that previously described with respect to FIG. 2 for the baseline method.

Next, a step of depositing a metal layer onto the HFET structure 1108 is performed so that the metal is in direct contact with the HFET semiconductor structure, forming source pad and drain pad pairs. As an example, ohmic metal deposition can occur in an electron-beam evaporator, where the ohmic metals are evaporated in the following sequence: 20 nm Ti, 200 nm Al, and 100 nm Pt. As another example, the a Ti layer may be deposited first, followed layers of Pt, Ni, or Au, or a combination thereof. Using this set of metals, typical thicknesses are between 100 and 200 Å thick for the Ti layer, between 1000 and 2000 Å thick for the Al layer, between 200 and 1000 Å thick for the Ni layer, between 1000 and 2000 Å thick for the Au layer, and between 500 and 2000 Å thick for the Pt layer.

After the metal deposition step 1108, a step is performed for removing the photoresist material to expose the semiconductor structure in areas other than the source pad and drain pad pairs 1110, such that each source pad and drain pad pair has a corresponding exposed area (thus lifting-off metal that covered the exposed areas). Some current photoresist strippers, for example, require soaking in the neighborhood of an hour at roughly 100 degrees Celsius, followed by rinsing in de-ionized water. The exact temperature and time used vary according to the specific chemicals used and according to the manner in which they are used.

Figure 12:
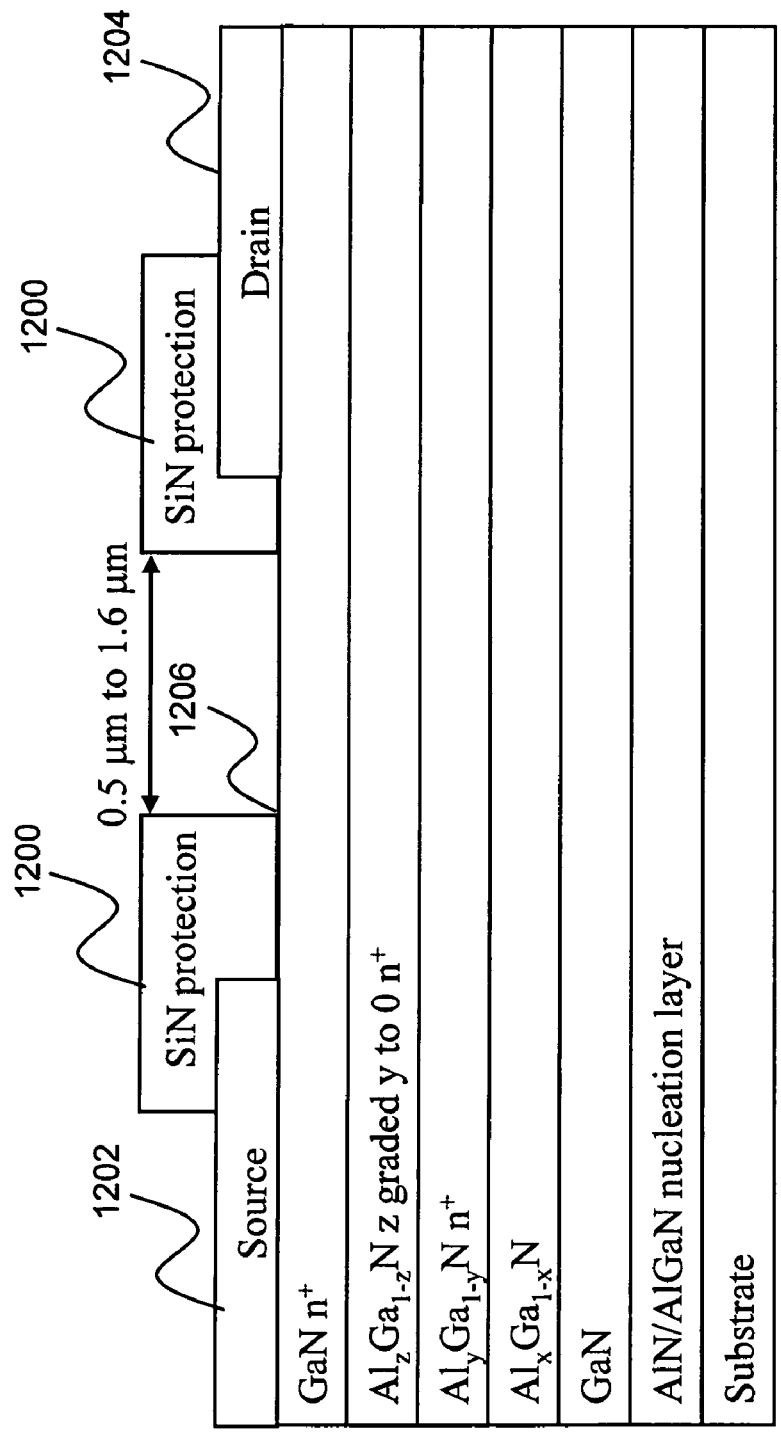
FIG. 12 is a depiction of the layer diagram of FIG. 11 after metal contacts have been added, and demonstrating the result of the optional step of adding a creep-prevention layer.

At this point, an optional step of depositing a creep-prevention layer 1012 is performed such that it covers at least a portion of each source pad and drain pad pair and a portion of each corresponding exposed area is performed. The creep-prevention layer prevents creep of the metals forming the source pads and drain pads into the corresponding exposed area during the annealing step 1014 (discussed below). The creep-prevention layer is generally formed a dielectric material such as SiN or $SiO_2$. Additionally, the creep-prevention layer helps to serve as a mask during the step of removing a further portion of the HFET semiconductor structure in the exposed area of the device to form a gate recess 1018 (discussed below). FIG. 12 shows an illustration of the result of the step of depositing a creep-prevention layer. As may be seen, the creep-prevention layer 1200 covers a portion of the source pad 1202, the drain pad 1204, and the exposed area 1206 not covered by the source pad 1202 and the drain pad 1204.

After the photoresist removal step 1010, or after the step of depositing a creep-prevention layer 1012 (if performed), a step of annealing the HFET semiconductor structure 1014 is performed. As a typical example, a rapid thermal annealing (RTA) process may be used, and is typically performed for 30 seconds at a temperature range between 600 and 900° C. in a reactively neutral environment. Examples of a reactively neutral environment include a substantial vacuum in which a non-reactively significant amount of gas remains, and an environment containing an ambient atmosphere of substantially non-reactive gases such as noble gases or nitrogen.

After the annealing step 1014 is completed, a step is performed for electrically isolating devices 1016 (on a wafer), with each device corresponding to a source and drain pad pair and a corresponding exposed area. Device isolation is typically achieved by mesa etching in which areas of the semiconductor structure are etched away to physically isolate devices, or by ion implantation in an area about each device so that each device is electrically isolated from others by a substantially non-conducting barrier.

Figure 13:
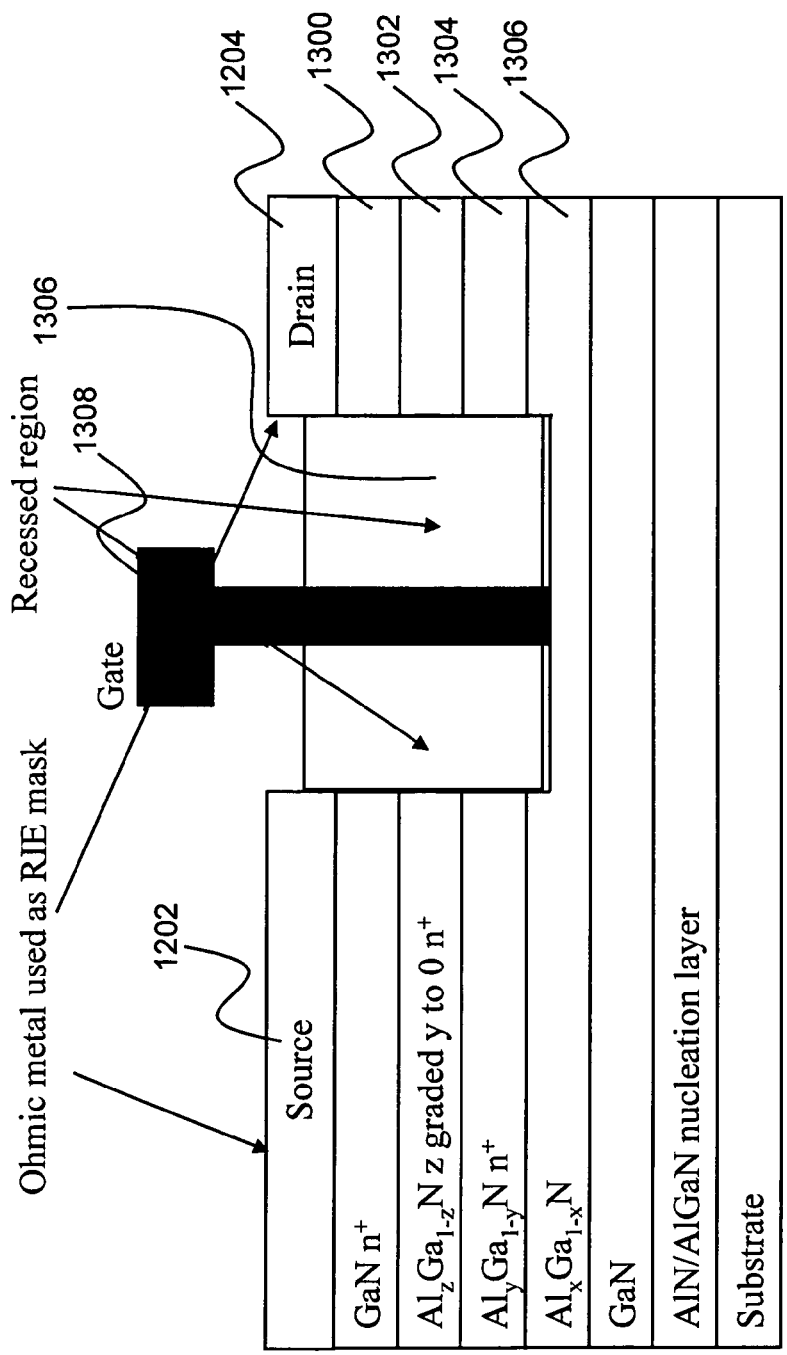
FIG. 13 is a depiction of the layer diagram of FIG. 12, after a gate recess area has been etched and a gate has been added in the gate recess.

Next, after the isolating step 1016, a step is performed for removing a further portion of the HFET semiconductor structure in the exposed area of each device to form a gate recess 1018, such that the source pads and the drain pads act as masks to protect areas of the structure thereunder. Gate recess etching is typically performed by a reactive ion etching (RIE) process or by wet chemical etching using the ohmic metal of the source and drain pads as well as the optional creep-prevention layer formed in step 1012 as a mask. In one aspect, chlorine plasma RIE could be used. The purpose of this step is to remove Si-doped GaN layer 1300, $Al_yGa_{1-y}N$ layer 1302, and $Al_zGa_{1-z}N$ layers 1304 (all n-doped layers) and to expose the undoped $Al_xGa_{1-x}N$ layer 1306 for deposition of gate metal 1308, as shown in FIG. 13. This step of gate recess etching is desirably performed done in a series of iterative steps. Between recess steps TLM measurements and open channel saturation current measurements are performed to determine the sheet resistance in the channel and the open channel source-to-drain saturation current. The recess etch is completed, for example, when sheet resistance in the channel corresponds to sheet resistance of undoped structure (330 to 450 Ohms/square) and when the open channel saturation current is in the 1.2 to 1.6 A/mm range. The table depicted in FIG. 14 contains example TLM measurements and open channel saturation current measurements during gate recess etching for a structure similar to that described in conjunction with this description of the method of the present invention. As a result of this further removal (etching) step 1018, the open channel saturation current was reduced from 1.9 to 1.2 A/mm and sheet resistance in the channel was increased from 220 to 330 Ohms/Square. The contact resistance Rt of approximately 0.4 Ohm-mm was obtained, and is approximately 50% of the lowest value obtained from the baseline process discussed previously. FIG. 15(*a*) and FIG. 15(*b*) show the open channel saturation current of the described HFET after gate recess etch in the center of a wafer and at the edge of a wafer, respectively.

After the further removal (etching) step 1018, a step is performed for forming a gate structure 1020 in the area of each gate recess such that the gate structure is electrically isolated from direct contact with the source pad and the drain pad, thereby resulting in transistor devices. In this step, the gate is desirably substantially T-shaped, and is formed of a material combination, examples of which could include compounds such as nickel/gold, platinum/titanium/gold, tungsten/titanium/gold, tungsten/aluminum, tungsten silicide/aluminum, and tungsten silicide/titanium/gold, where the first metal in each layer combination is the first deposited. The gate fabrication is typically performed by bi-layer electron-beam lithography. The gate metal in the example herein is comprises a 20 nm Ni layer and a 330 nm Au layer material combination.

Figure 16A:
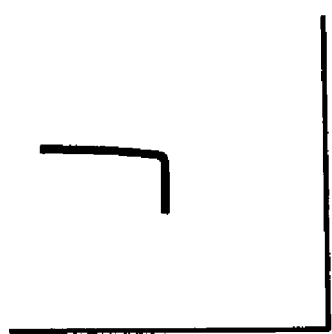
FIG. 16($a$) is an example of a forward bias I-V characteristic of the Schottky gate of a device fabricated by the method of the present invention.
Figure 16B:
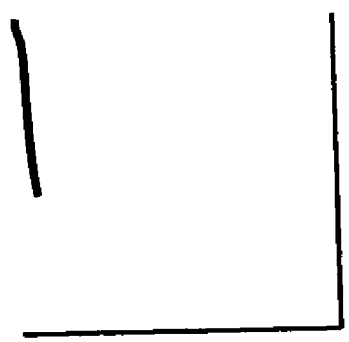

FIG. 16(*a*) and FIG. 16(*b*) show example forward and reverse bias I-V (current-voltage) characteristics, respectively, of the Schottky gate of a device fabricated by the method of the present invention. The gate-drain reverse bias breakdown voltage of 70 V is comparable to values for devices fabricated by the baseline process.

Figure 17A:
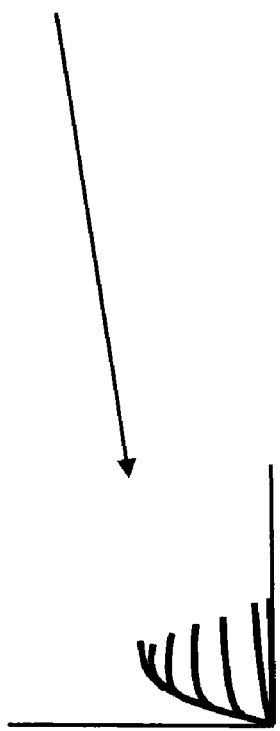
FIG. 17($a$) is an example of an I-V characteristic of the Schottky gate of a device fabricated by the method of the present invention, taken at the center of a wafer.
Figure 17B:
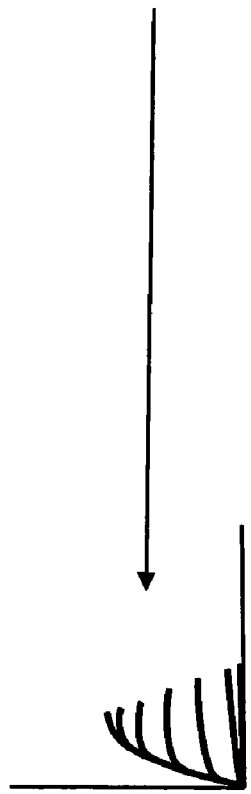

FIG. 17(*a*) and FIG. 17(*b*) show common source I-V curves of devices fabricated by the method of the present invention at the center of a wafer and at the edge of a wafer, respectively. The I-V curves were measured for a column of devices spaced by reticle height. The common source IV curves of the device in the center of the wafer are shown on the top. I-V curves shown below are of sister devices from the same column, measured from center to edge of the wafer. FIG. 17 illustrates the remarkable uniformity of I-V characteristics of devices fabricated by process presented herein. The pinch-off voltage of devices was −3.5 volts and the saturation current density was 1 A/mm. Another advantage of the described process is that it can be used to tune the pinch-off voltage devices and can be used to fabricate on the same wafer devices with different values of pinch voltage in a controlled manner. This can be done by selectively protecting certain devices from exposure to etching solution (plasma) during entire duration or part of the duration of further removal (etching) step 1018.

After the step of forming the gate structure 1020 is complete, a step of forming a passivation layer on the transistor devices. The passivation layer is typically formed of a dielectric layer such as silicon nitride.

Next, various aspects of devices that may be created by this process and the specifications for the materials that are used in each are presented.

(2) The Device Aspect

A variety of structures may be formed and used in conjunction with the method discussed previously. In this section, various structures and various material and parameter combinations for the structures will be presented.

In one aspect, a relatively simple aspect, the structure of the present invention comprises a semiconductor layer structure for a GaN/AlGaN heterojunction field effect transistor as shown in FIG. 18. Note that FIG. 18 is a table/layer diagram including columns including layer names, layer materials, layer doping ranges, and layer thickness ranges for each layer (row). The device comprises a substrate 1800. The substrate 1800 may be formed of any material compatible with adjacent layers, and is typically comprised of silicon carbide, sapphire, gallium nitride, or aluminum nitride.

A nucleation layer 1802 is formed on the substrate, typically formed of aluminum nitride. The thickness of the nucleation layer 1802 is typically approximately 100 to 300 Å.

A buffer layer 1804 is formed on the nucleation layer 1802. The buffer layer 1804 is generally GaN or AlGaN, and has a thickness approximately between 1000-40,000 Å. More particularly, it is desirable for the buffer layer to be formed of $Al_xGa_{1-x}N$, where x is approximately between 0.0 and 0.2.

A channel layer 1806 is formed on the buffer layer 1804, and is typically comprised of GaN or InGaN. The channel layer 1806 desirably has a thickness approximately between 50-1000 Å, and is formed of $In_xGa_{1-x}N$, where x is approximately between 0.0 and 0.1.

A Schottky barrier layer structure 1808 is formed on the channel layer 1806, the Schottky barrier layer 1808 comprises an undoped Schottky layer 1808*a* comprised AlGaN or InAlGaN. The undoped Schottky layer 1808*a* desirably has a thickness approximately between 100 to 300 Å and is formed of $In_xAl_yGa_{1-x-y}N$, where x is approximately between 0.0 and 0.1 and y is approximately between 0.15 and 0.5.

Optionally, the Schottky barrier layer 1808 may comprise two additional layers between the undoped Schottky layer 1808*a* and the channel layer 1806. The additional layers include a doped Schottky layer 1808*b* and a spacer Schottky layer 1808*c*, with the doped Schottky layer 1808*b* adjacent the undoped Schottky layer 1808*c* and the spacer Schottky layer 1808*b* formed between the doped Schottky layer 1808*b* and the channel layer 1806. The doped Schottky layer 1808*b* is formed of AlGaN or InAlGaN. It is desirable that the doped Schottky layer 1808*b* is n-doped to approximately between $1 \times 10^{19}$ cm$^{-3}$ and $7 \times 10^{19}$ cm$^{-3}$, has a thickness approximately between 10 to 20 Å, and is formed of $In_xAl_yGa_{1-x-y}N$, where x is approximately between 0.0 and 0.1 and y is approximately between 0.15 and 0.5. The spacer Schottky layer 1808*c*, on the other hand, is formed of AlGaN or InAlGaN. The spacer Schottky layer 1808*c* is undoped and desirably has a thickness approximately between 40 to 95 Å and is formed of $In_xAl_yGa_{1-x-y}N$, where x is approximately between 0.0 and 0.1 and y is approximately between 0.15 and 0.5.

In addition, a contact layer structure 1810 is formed on the Schottky barrier structure 1808. The contact layer structure 1810 comprises a first contact layer 1810a formed on the undoped Schottky barrier layer 1808a. The first contact layer 1810a is formed of AlGaN or InAlGaN. The first contact layer 1810a is desirably n-doped to approximately between $1 \times 10^{19}$ cm$^{-3}$ and $7 \times 10^{19}$ cm$^{-3}$, has a thickness approximately between 50 to 300 Å, and is formed of In$_x$Al$_y$Ga$_{1-x-y}$N, where x is approximately between 0.0 and 0.1 and y is approximately between 0.0 and 0.5.

The contact layer structure 1810 further comprises a doped contact cap layer 1810b formed on the first contact layer 1810a and formed of GaN or InGaN. Desirably, the doped contact cap layer 1810b is n-doped to approximately between $1 \times 10^{19}$ cm$^{-3}$ and $7 \times 10^{19}$ cm$^{-3}$, has a thickness approximately between 100 to 600 Å, and is formed of In$_x$Ga$_{1-x}$N, where x is approximately between 0.0 and 0.1.

At least a portion of the first contact layer 1810a may be graded, desirably such that y varies gradually from 0.5 to 0.0 from an interface with the doped contact top layer 1810b and the undoped Schottky layer 1808a.

Further, the contact layer structure 1810 can further comprise a contact delta-doped layer 1810c formed between the first contact layer 1810a and the undoped Schottky layer 1808a. Typically, the contact delta-doped layer 1810c is formed of a plurality of sublayers. Each of the sublayers of the delta-doped layer 1810c is comprised of AlGaN or InAlGaN. Desirably, each of the sublayers of the delta-doped layer 1810c is formed of In$_x$Al$_y$Ga$_{1-x-y}$N, where x is approximately between 0.0 and 0.1 and y is approximately between 0.15 and 0.5, has a sheet density of approximately between $1 \times 10^{12}$ and $3 \times 10^{12}$ cm$^{-2}$, and has a separation of approximately between 3 and 5 Å. It is further desirable that the delta-doped layer comprise four sublayers.

Referring briefly to FIG. 13, to form a device, the semiconductor layer structure further comprises a source contact pad 1202 and a drain contact pad 1204, and wherein a gate 1308 is formed in contact with the Schottky layer structure 1808 such that the source contact pad 1202, the drain contact pad 1204, and the gate 1308 are electrically isolated from each other, forming a transistor device.

After the device is formed, a passivation layer can optionally be added to the device. Typically, the passivation layer is comprised of a dielectric material such as silicon nitride.

The invention claimed is:

1. A method for fabricating heterojunction field effect transistors (HFET) comprising steps of:
    depositing a HFET semiconductor structure onto a substrate;
    depositing a photoresist material onto the HFET semiconductor structure;
    selectively removing portions of the photoresist material corresponding to source pad and drain pad pairs;
    depositing a metal layer onto the HFET semiconductor structure so that the metal is in direct contact with the HFET semiconductor structure, forming source pad and drain pad pairs;
    removing the photoresist material to expose the semiconductor structure in areas other than the source pad and drain pad pairs, with each source pad and drain pad pair having a corresponding exposed area;
    annealing the HFET semiconductor structure;
    electrically isolating devices, with each device comprising a source pad and drain pad pair and a corresponding exposed area;
    removing a further portion of the HFET semiconductor structure in the exposed area of each device to form a gate recess, such that the source pads and drain pads act as masks to protect areas of the HFET semiconductor structure thereunder; and
    forming a gate structure in the area of each gate recess such that the gate structure is electrically isolated from direct contact with source pad and the drain pad, thereby resulting in transistor devices.

2. The method of claim 1, wherein in the step of depositing a metal layer onto the HFET semiconductor structure is performed by depositing a titanium layer followed by an aluminum layer followed by layers selected from a group consisting of a platinum layer, and a nickel layer followed by a gold layer.

3. The method of claim 2, wherein the step of depositing the metal layer onto the HFET semiconductor structure is performed as an ohmic metal deposition by evaporation.

4. The method of claim 3, wherein the titanium layer is between 100 and 200 Å thick, the aluminum layer is between 1000 and 2000 Å thick, the nickel layer is between 200 and 1000 Å thick, the gold layer is between 1000 and 2000 Å thick, and the platinum layer is between 500 and 2000 Å thick.

5. The method of claim 4, wherein the step of annealing is performed in a reactively neutral environment.

6. The method of claim 5, wherein the step of annealing is performed in an environment selected from a group consisting of substantially non-reactive gases and a substantial vacuum.

7. The method of claim 6, wherein the substantially non-reactive gases are selected from a group consisting of nitrogen and noble gases.

8. The method of claim 7, wherein the step of annealing is performed for approximately 30 seconds at a temperature approximately between 600 and 900 degrees Celsius.

9. The method of claim 8, wherein the step of electrically isolating devices is performed by a process selected from the group consisting of mesa etching between devices to physically isolate the devices and ion implanting an area about each device to isolate each device with a substantially non-conductive barrier.

10. The method of claim 9, wherein the step of removing a further portion of the HFET semiconductor structure in the exposed area of each device is performed iteratively.

11. The method of claim 10, wherein the HFET semiconductor structure comprises an n-doped region and a undoped region, with the undoped region formed on the substrate and the n-doped region formed on the undoped region opposite the substrate, and wherein the step removing a further portion of the HFET semiconductor structure in the exposed area of each device is performed to remove the n-doped region in the exposed area of each device, and to form a gate recess.

12. The method of claim 11, wherein, between iterative steps, measurements of the sheet resistance are taken in the gate recess to determine when the sheet resistance in the gate recess corresponds to a sheet resistance of the undoped region, and when the sheet resistance in the gate recess corresponds to a sheet resistance of the undoped region, the iteration is stopped.

13. The method of claim 12, wherein the step of removing a further portion of the HFET semiconductor structure is performed by a process selected from a group consisting of reactive ion etching and wet chemical etching.

14. The method of claim 13, wherein the process is chlorine reactive ion etching.

15. The method of claim 14, wherein the gate structure is formed in a substantially t-shaped manner.

16. The method of claim 15, wherein the gate structure is formed of a metal layer combination selected from a group consisting of nickel/gold, platinum/titanium/gold, tungsten/titanium/gold, tungsten/aluminum, tungsten silicide/aluminum, and tungsten silicide/titanium/gold, where the first metal in each layer combination is the first deposited.

17. The method of claim 16, comprising a further step, between the steps of removing the photoresist and annealing, of depositing a creep-prevention layer such that it covers at least a portion of each source pad and drain pad pair and a portion of each corresponding exposed area such that the creep-prevention layer prevents creep of the source pad and drain pad into the corresponding exposed area during the step of annealing.

18. The method of claim 17, wherein the creep-prevention layer is formed of a material selected from a group consisting of silicon nitride and silicon dioxide.

19. The method of claim 18, wherein in the step of removing a further portion of the HFET semiconductor structure, the creep-prevention layer is removed.

20. The method of claim 19, wherein the method comprises a further step of forming a passivation layer on the transistor devices.

21. The method of claim 20, wherein the passivation layer is formed of a dielectric material.

22. The method of claim 21, wherein the passivation layer is formed of silicon nitride.

23. A heterojunction field effect transistor produced by the method of claim 1.

24. The method of claim 1, wherein the step of annealing is performed in a reactively neutral environment.

25. The method of claim 24, wherein the step of annealing is performed in an environment selected from a group consisting of substantially non-reactive gases and a substantial vacuum.

26. The method of claim 25, wherein the substantially non-reactive gases are selected from a group consisting of nitrogen and noble gases.

27. The method of claim 26, wherein the step of annealing is performed for approximately 30 seconds at a temperature approximately between 600 and 900 degrees Celsius.

28. The method of claim 1, wherein the step of electrically isolating devices is performed by a process selected from the group consisting of mesa etching between devices to physically isolate the devices and ion implanting an area about each device to isolate each device with a substantially non-conductive barrier.

29. The method of claim 1, wherein the step of removing a further portion of the HFET semiconductor structure in the exposed area of each device is performed iteratively.

30. The method of claim 29, wherein the HFET semiconductor structure comprises an n-doped region and a undoped region, with the undoped region formed on the substrate and the n-doped region formed on the undoped region opposite the substrate, and wherein the step removing a further portion of the HFET semiconductor structure in the exposed area of each device is performed to remove the n-doped region in the exposed area of each device, and to form a gate recess.

31. The method of claim 30, wherein, between iterative steps, measurements of the sheet resistance are taken in the gate recess to determine when the sheet resistance in the gate recess corresponds to a sheet resistance of the undoped region, and when the sheet resistance in the gate recess corresponds to a sheet resistance of the undoped region, the iteration is stopped.

32. The method of claim 31, wherein the step of removing a further portion of the HFET semiconductor structure is performed by a process selected from a group consisting of reactive ion etching and wet chemical etching.

33. The method of claim 32, wherein the process is chlorine reactive ion etching.

34. The method of claim 1, wherein the gate structure is formed in a substantially t-shaped manner.

35. The method of claim 34, wherein the gate structure is formed of a metal layer combination selected from a group consisting of nickel/gold, platinum/titanium/gold, tungsten/titanium/gold, tungsten/aluminum, tungsten silicide/aluminum, and tungsten silicide/titanium/gold, where the first metal in each layer combination is the first deposited.

36. The method of claim 1, comprising a further step, between the steps of removing the photoresist and annealing, of depositing a creep-prevention layer such that it covers at least a portion of each source pad and drain pad pair and a portion of each corresponding exposed area such that the creep-prevention layer prevents creep of the source pad and drain pad into the corresponding exposed area during the step of annealing.

37. The method of claim 36, wherein the creep-prevention layer is formed of a material selected from a group consisting of silicon nitride and silicon dioxide.

38. The method of claim 37, wherein in the step of removing a further portion of the HFET semiconductor structure, the creep-prevention layer is removed.

39. The method of claim 1, wherein the method comprises a further step of forming a passivation layer on the transistor devices.

40. The method of claim 39, wherein the passivation layer is formed of a dielectric material.

41. The method of claim 40, wherein the passivation layer is formed of silicon nitride.

42. A heterojunction field effect transistor produced by the method of claim 22.

* * * * *